(12) United States Patent
Lambert et al.

(10) Patent No.: US 11,516,945 B2
(45) Date of Patent: Nov. 29, 2022

(54) SYSTEM AND METHOD FOR AIR MOVER IDENTIFICATION

(71) Applicant: Dell Products L.P., Hopkinton, MA (US)

(72) Inventors: Timothy M. Lambert, Austin, TX (US); Pablo R. Arias, Austin, TX (US)

(73) Assignee: Dell Products L.P., Hopkinton, MA (US)

( * ) Notice: Subject to any disclaimer, the term of this patent is extended or adjusted under 35 U.S.C. 154(b) by 172 days.

(21) Appl. No.: 16/776,002

(22) Filed: Jan. 29, 2020

(65) Prior Publication Data

US 2021/0235600 A1  Jul. 29, 2021

(51) Int. Cl.
*H05K 7/20* (2006.01)
*G05B 15/02* (2006.01)
*G01R 31/34* (2020.01)

(52) U.S. Cl.
CPC ......... *H05K 7/20836* (2013.01); *G01R 31/34* (2013.01); *G05B 15/02* (2013.01); *H05K 7/20727* (2013.01)

(58) Field of Classification Search
None
See application file for complete search history.

(56) References Cited

U.S. PATENT DOCUMENTS

| | | | |
|---|---|---|---|
| 2007/0089446 A1* | 4/2007 | Larson | H01L 23/34 62/259.2 |
| 2014/0192475 A1* | 7/2014 | Tunks | G06F 1/206 361/679.31 |
| 2017/0219239 A1* | 8/2017 | Lovicott | G06F 1/20 |
| 2020/0221603 A1* | 7/2020 | Shabbir | H05K 7/20209 |

* cited by examiner

*Primary Examiner* — Mohammad Ali
*Assistant Examiner* — Saad M Kabir
(74) *Attorney, Agent, or Firm* — Chamberlain, Hrdlicka, White, Williams & Aughtry

(57) ABSTRACT

An information handling system includes an air mover and a thermal manager. The thermal manager identifies an air mover identification event for the air mover; in response to identifying the air mover identification event: places the air mover in a type identification state, and while the air mover is in the type identification state, identifies a type of the air mover; and, after identifying the type of the air mover, places the air mover in an active state based on the type of the air mover.

17 Claims, 11 Drawing Sheets

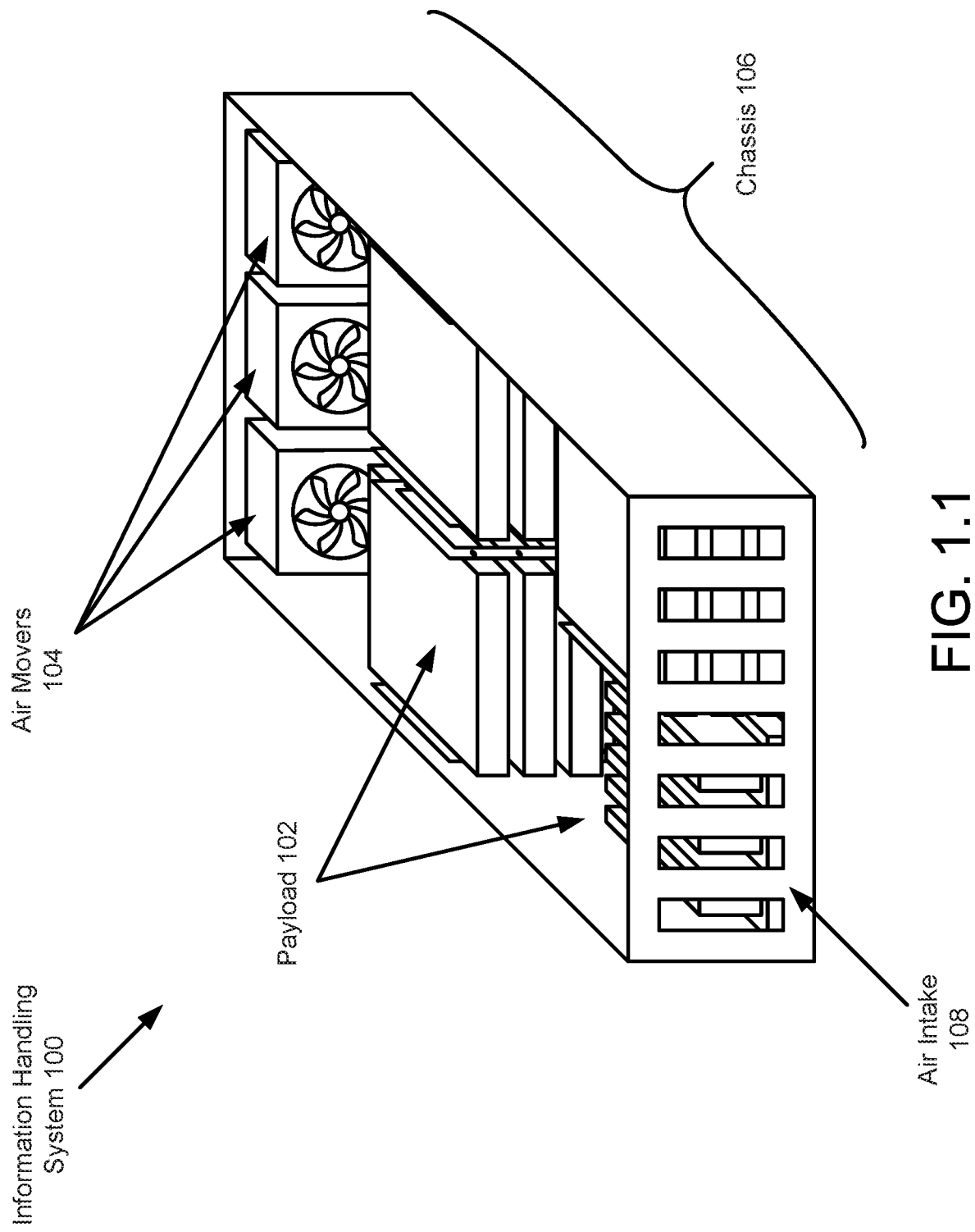
FIG. 1.1

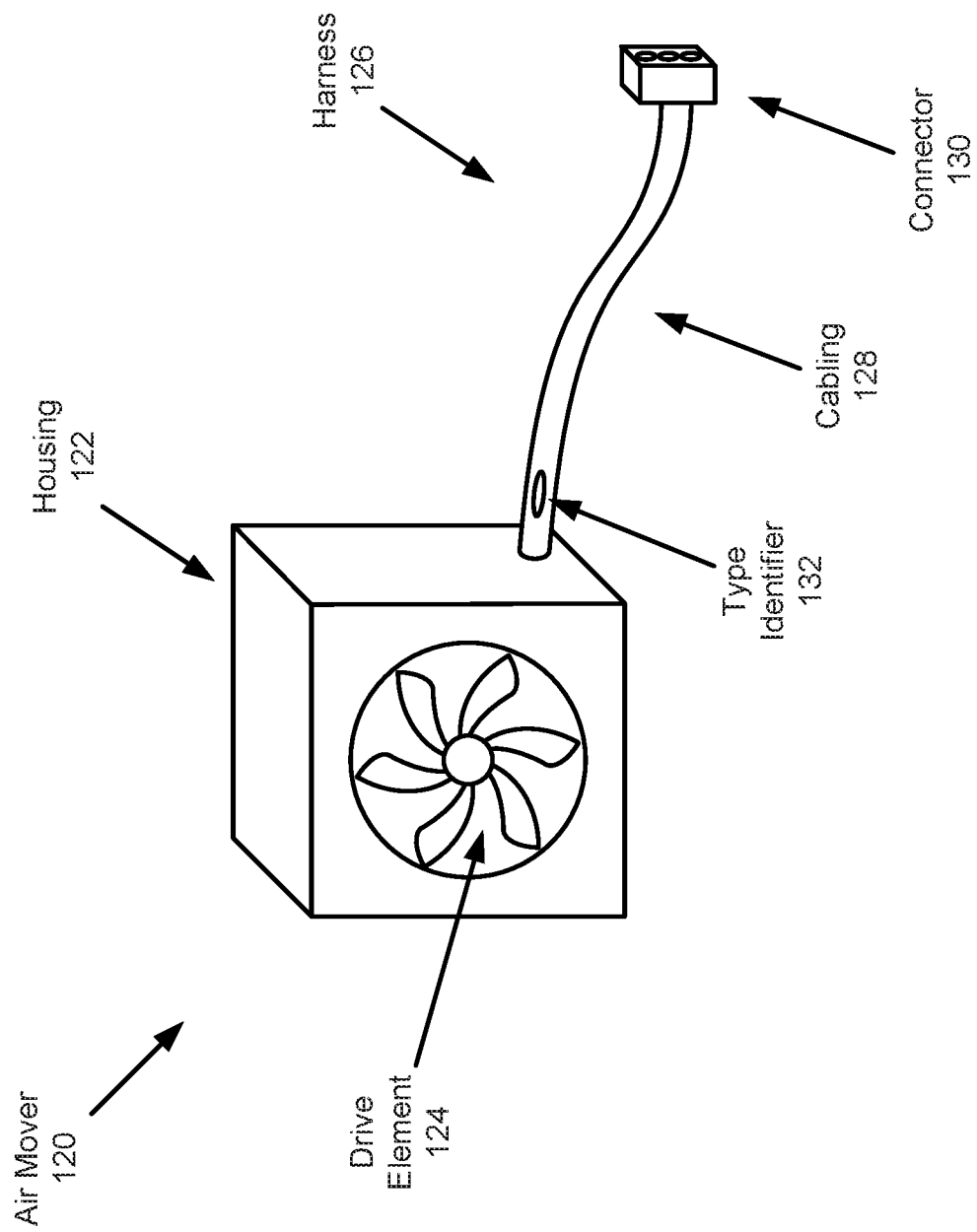
FIG. 1.2

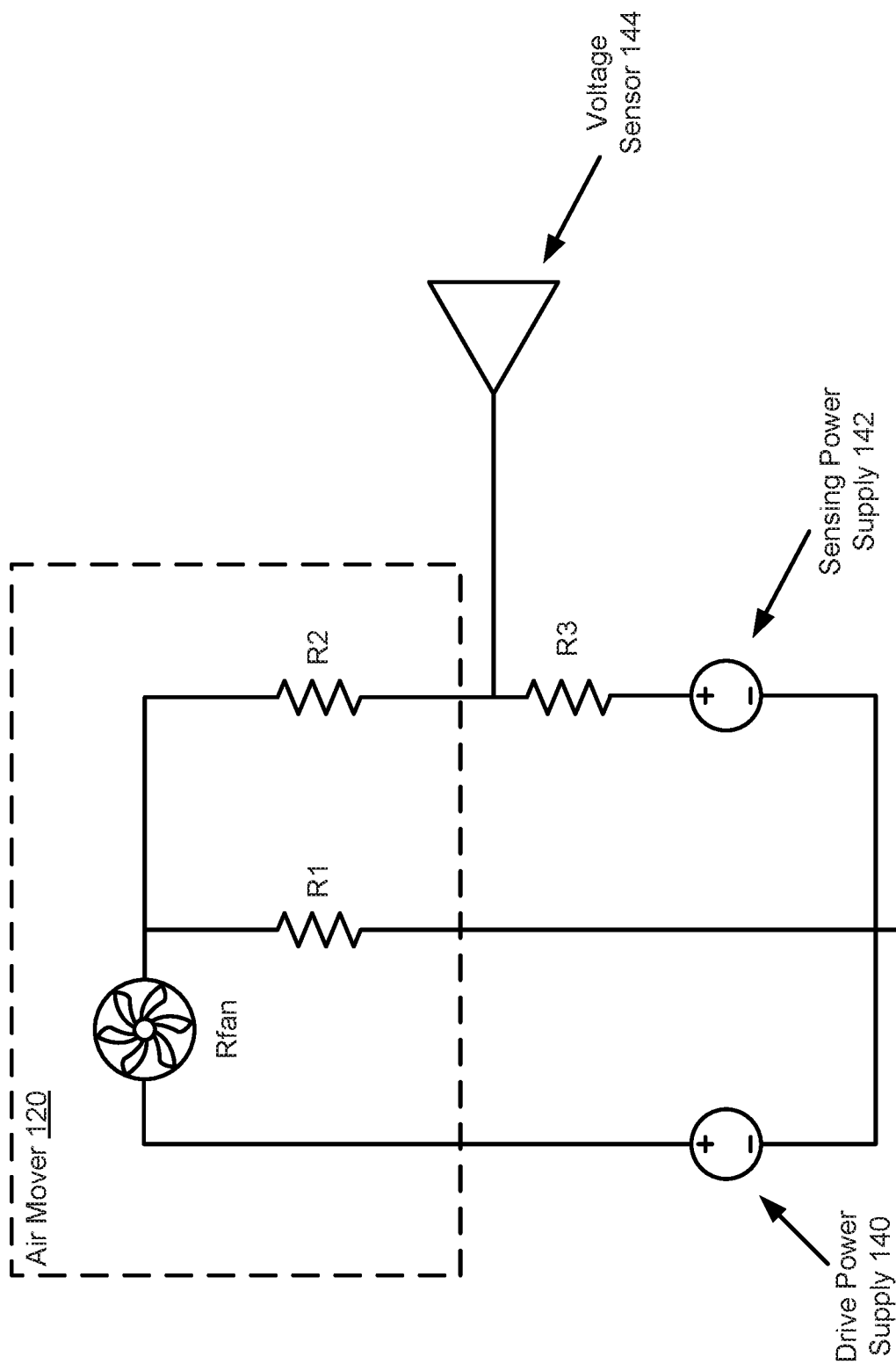
FIG. 1.3

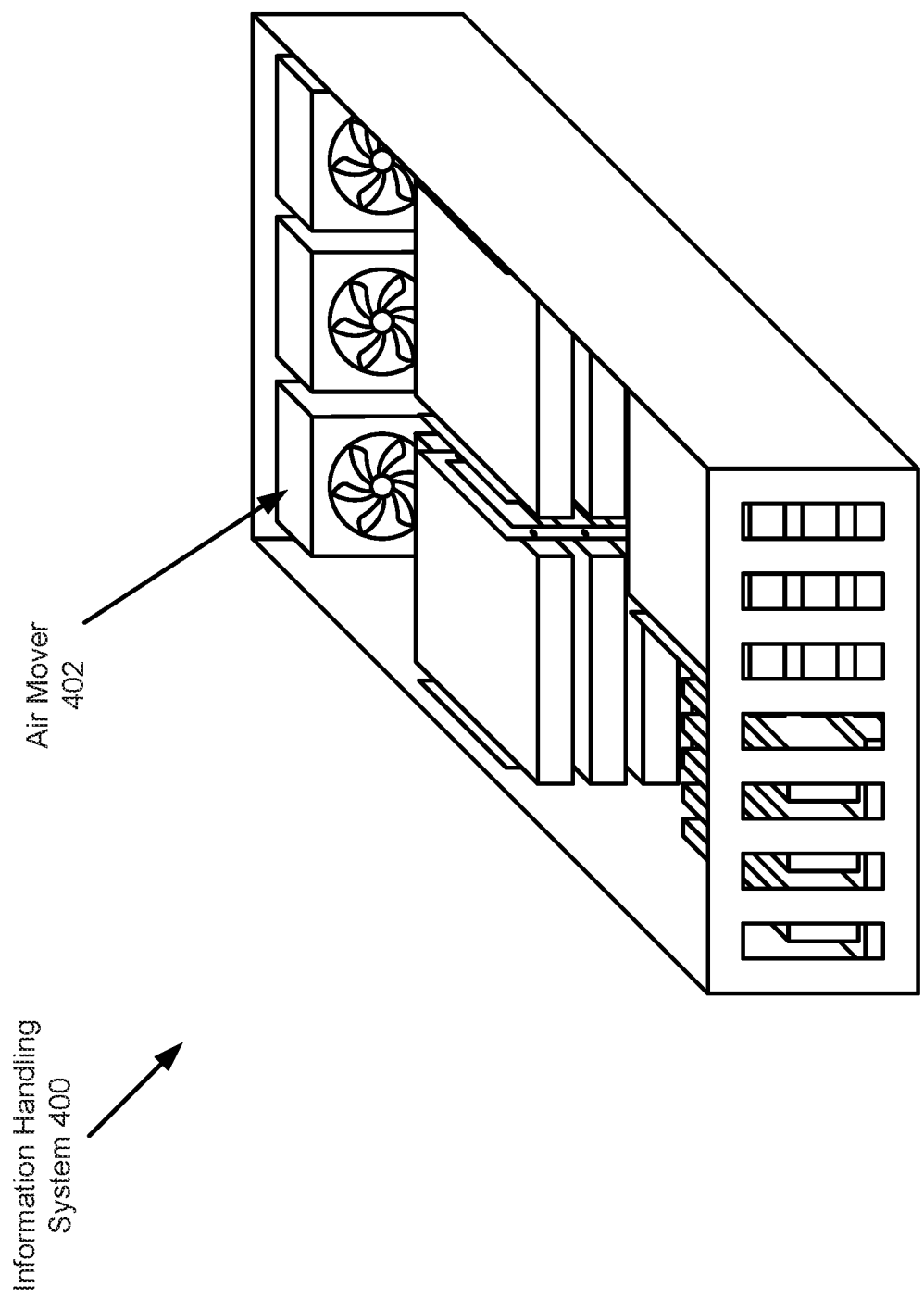
FIG. 4.1

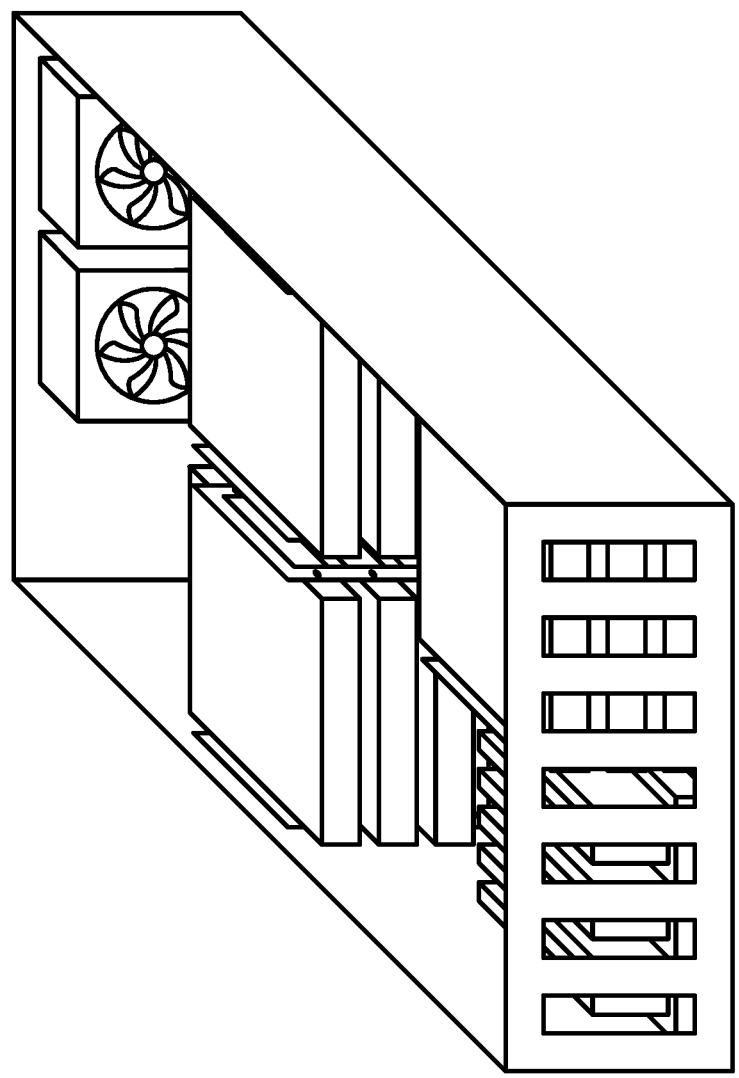
FIG. 4.2

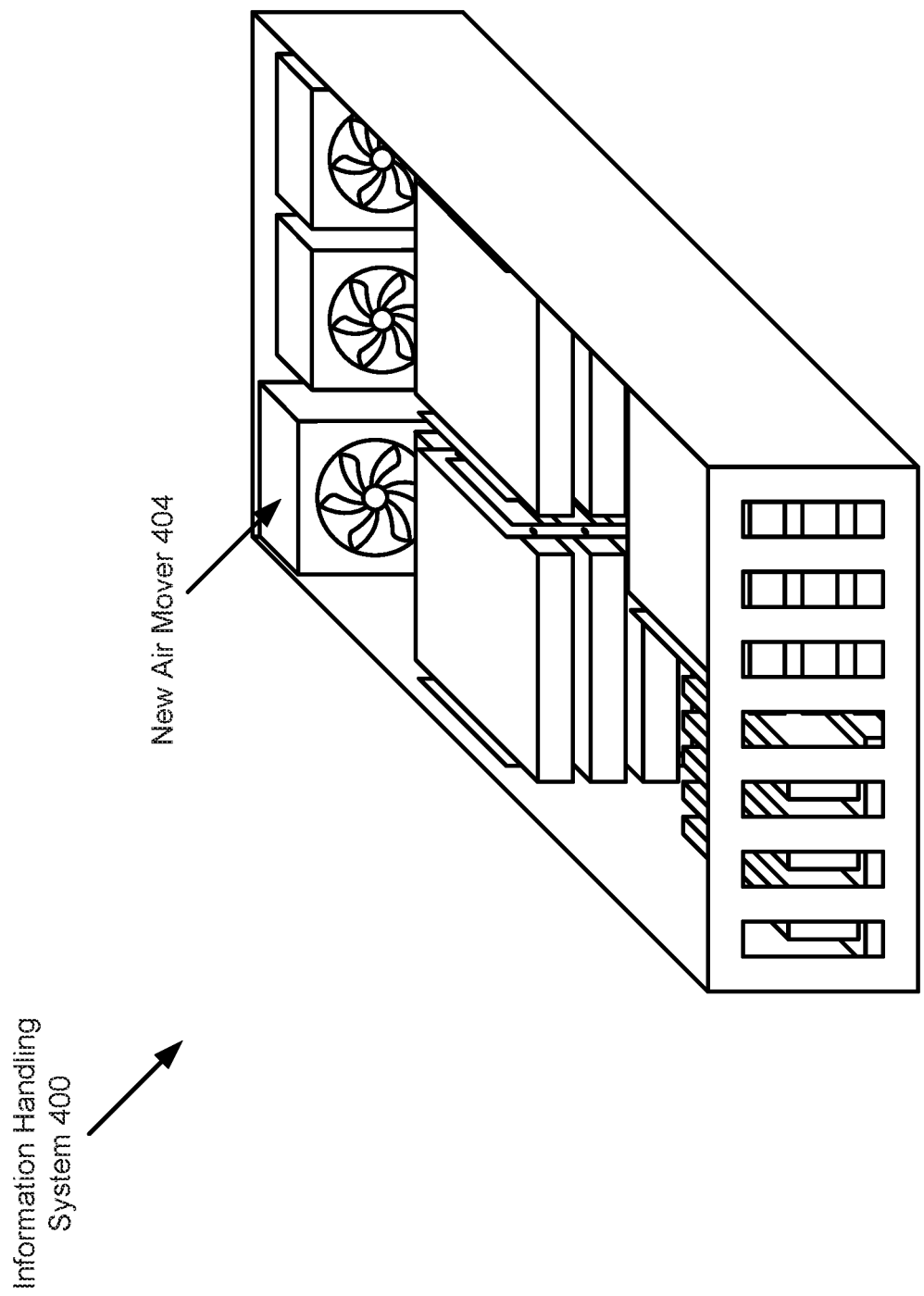
FIG. 4.3

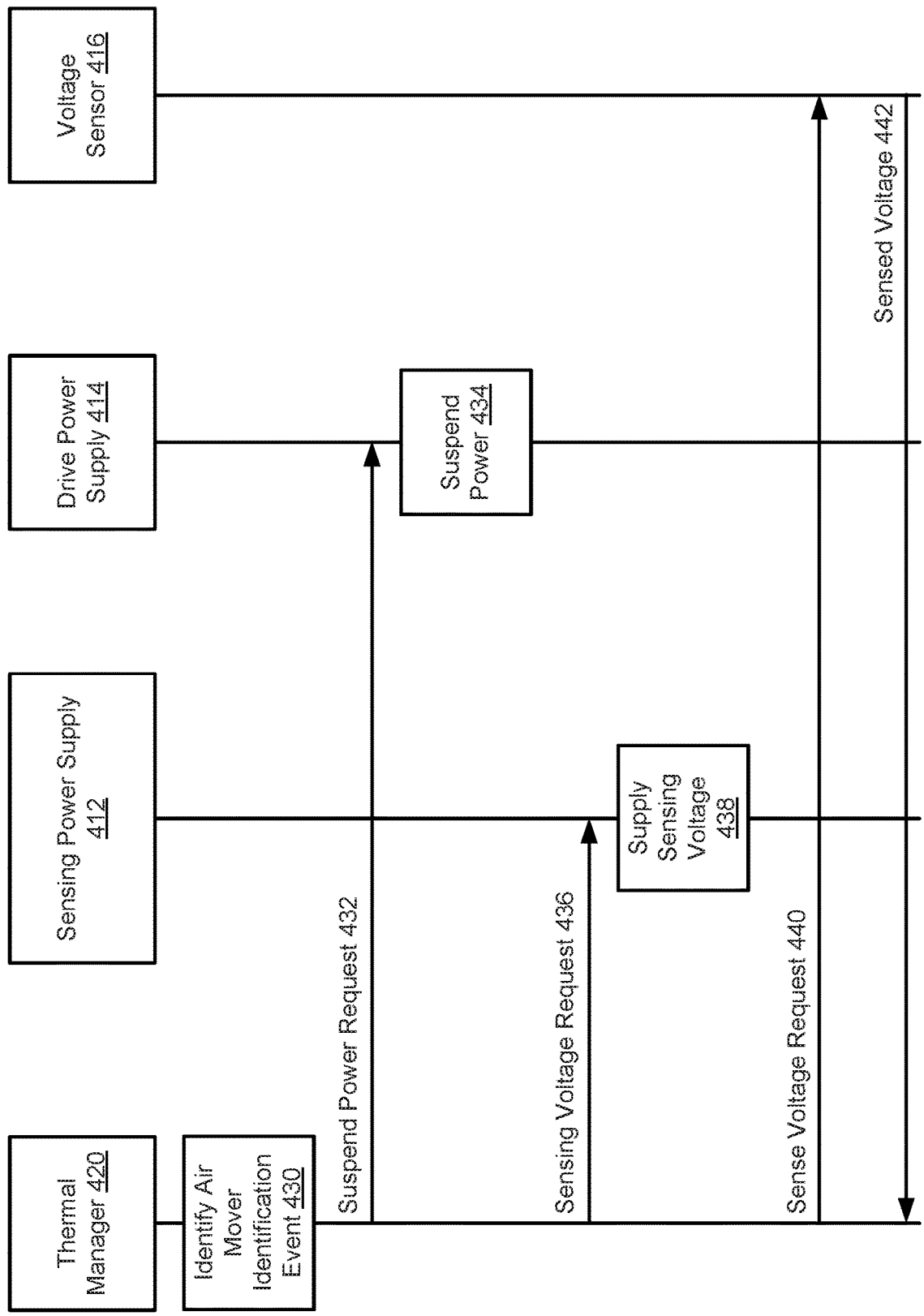
FIG. 4.4

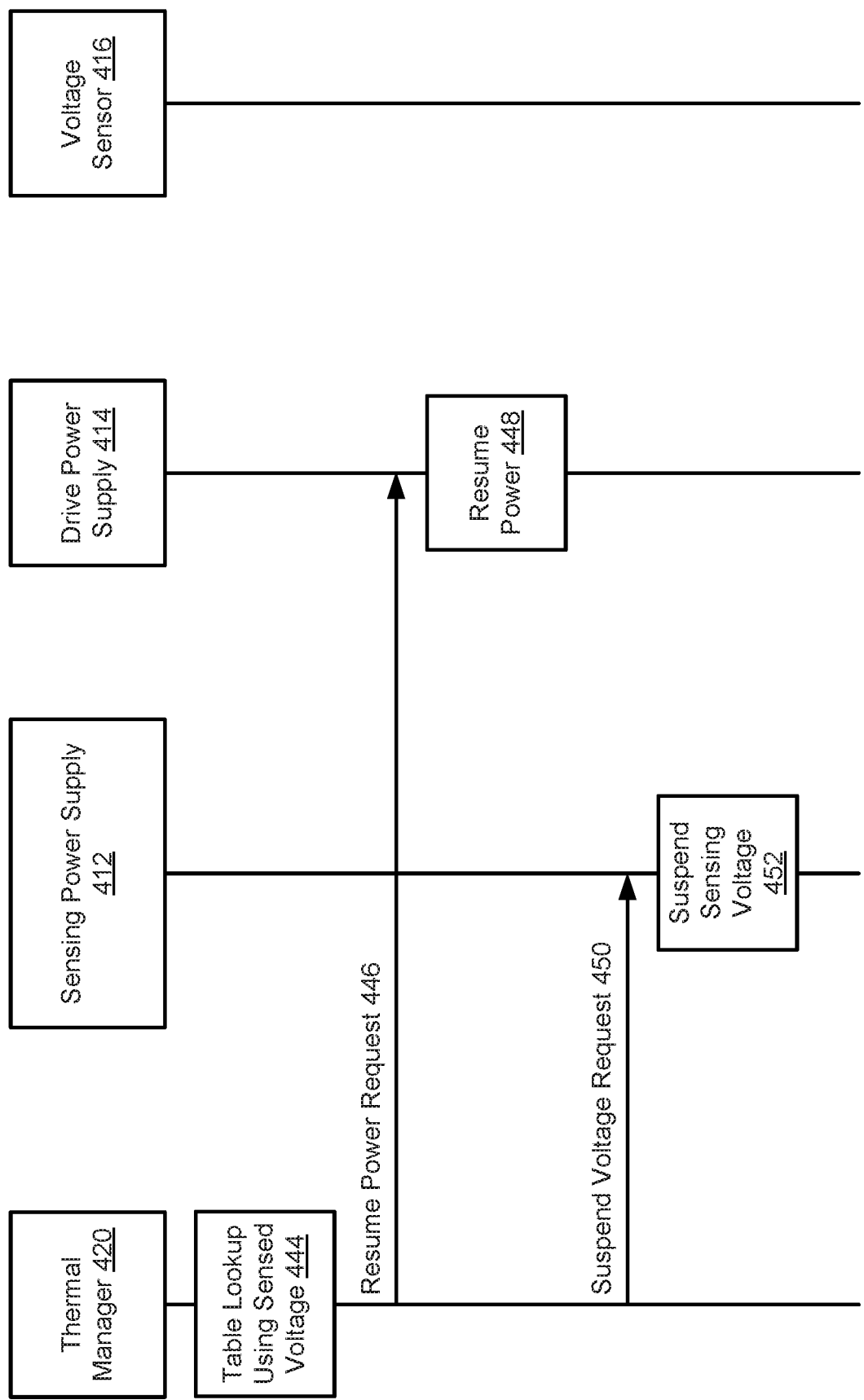
FIG. 4.5

SYSTEM AND METHOD FOR AIR MOVER IDENTIFICATION

BACKGROUND

Computing devices may provide computer implemented services. To provide the computer implemented services, the computing devices may include hardware components and software components. The software components may utilize the hardware components to provide the services.

SUMMARY

In one aspect, an information handling system in accordance with one or more embodiments of the invention includes an air mover and a thermal manager. The thermal manager identifies an air mover identification event for the air mover; in response to identifying the air mover identification event: places the air mover in a type identification state, and while the air mover is in the type identification state, identifies a type of the air mover; and, after identifying the type of the air mover, places the air mover in an active state based on the type of the air mover.

In one aspect, a method for managing an information handling system in accordance with one or more embodiments of the invention includes identifying an air mover identification event for an air mover of the information handling system; in response to identifying the air mover identification event: placing the air mover in a type identification state, and, while the air mover is in the type identification state, identifying a type of the air mover; and, after identifying the type of the air mover, placing the air mover in an active state based on the type of the air mover.

In one aspect, a non-transitory computer readable medium in accordance with one or more embodiments of the invention includes computer readable program code, which when executed by a computer processor enables the computer processor to perform a method for managing an information handling system. The method includes identifying an air mover identification event for an air mover of the information handling system; in response to identifying the air mover identification event: placing the air mover in a type identification state, and, while the air mover is in the type identification state, identifying a type of the air mover; and, after identifying the type of the air mover, placing the air mover in an active state based on the type of the air mover.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of an air mover in accordance with one or more embodiments of the invention.

FIG. 1.3 shows an electrical schematic diagram of an air mover in accordance with one or more embodiments of the invention.

FIGS. 4.1-4.3 show diagrams of an example information handling system over time.

FIGS. 4.4-4.5 show diagrams of actions by and/or interactions between components of the information handling system of FIG. 4.3 over time.

DETAILED DESCRIPTION

Figure 2:
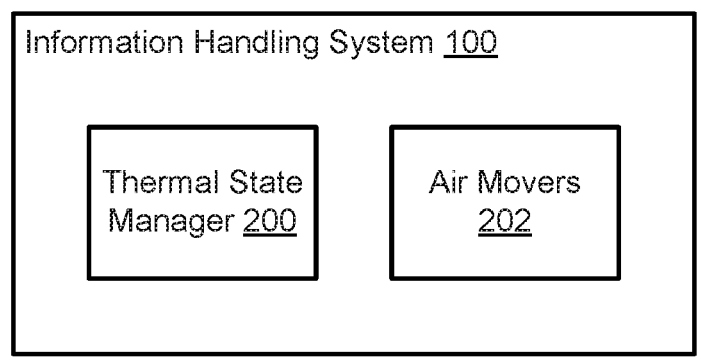
FIG. 2 shows a logical diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

In general, embodiments of the invention relate to systems, devices, and methods for managing the thermal states of components of an information handling system (IHS). An information handling system may be devices including hardware devices used to provide computer implemented services. When used, the hardware devices may generate thermal energy that may need to be dissipated to manage their thermal states.

To manage the thermal states of the hardware devices, the IHSs may utilize air movers to generate air flows. The air flows may dissipate the thermal energy generated by the hardware devices. By doing so, the thermal states of the hardware devices may be maintained within predetermined operating ranges of the hardware devices.

To utilize the air movers, power may need to be supplied to the air movers. However, the manner in which power needs to be supplied to the air movers may depend on a type of the air mover. For example, different types of air movers may require that, for example, different voltage levels be provided to the air movers. If the air movers are powered in a manner that is inconsistent with their respective types, the air movers may operate inefficiently, may be damaged, and/or may have a reduced service life.

Embodiments of the invention may provide a system that identifies the types of air movers when providing thermal management services. By identifying the types of the air movers, the manner in which to optimally power the air movers for a desired outcome may be determined. Consequently, the air movers may be powered in an efficient manner for the desired outcome by identifying the types of the air movers.

To identify a type of an air mover, the system may place the air mover into a type identification state prior to attempting to identify the type of the air mover. By placing the air mover into the type identification state, the accuracy of performing the identification may be improved. By more accurately identifying the type of the air mover, a system in accordance with embodiments of the invention may improve the service life of the air movers, improve the efficiency of providing thermal management services, and/or may prevent the air movers from being damaged due to being powered in a manner that is inconsistent with the type of the air mover.

FIG. 1 shows an information handling system (IHS) (100) in accordance with one or more embodiments of the invention. The IHS (100) may provide computer implemented services. The computer implemented services may include, for example, database services, data storage services, electronic communications services, and/or other types of services that may be implemented using computing devices.

To provide computer implemented services, the IHS (100) may include a payload (102). The payload (102) may include any number and type of hardware devices that provide computing resource (e.g., processing resource, memory resource, storage resources, communication resource, etc.). The hardware devices may form, for example, a computing device. For additional details regarding a computing device, refer to FIG. 5.

The payload (102) may be used by applications or other types of logical entities hosted by the IHS (100). The logical entities may utilize the computing resources provided by the hardware components of the payload (102) to provide all, or a portion, of the services provided by the IHS (100). For example, the logical entities may utilize the computing resources to execute (e.g., processing of program code by a processor that gives rise to the functionality of logical entities).

When the IHS (100) is operating, the hardware components of the payload (102) may generate thermal energy. The generated thermal energy may cause the temperatures all, or a portion, of the hardware devices of the payload (102) to increase.

The hardware components of the payload (102) may each have a predetermined temperature range in which the hardware components are to be maintained to support their respective operations. If the temperature of the hardware components goes outside of the predetermined temperature range, the (i) hardware components may not operate correctly (e.g., cause operating errors), (ii) the operation life of the hardware components may decrease at an accelerated rate, (iii) the operational efficiency (e.g., power use rate) of the hardware components may decrease, and/or (iv) the hardware components may operate in a manner that diverges from a predetermined manner of operation (e.g., a desired manner of operating). The hardware components may be impacted in different manners when operating outside of the predetermined temperature range without departing from the invention.

To reduce the likelihood that the temperatures of the hardware components of the payload (102) goes outside of the predetermined temperature range, the IHS (100) may include any number of air mover (104). An air mover may be a physical device that is adapted to generate an air flow. The air flows generated by the air movers (104) may be used to regulate the temperatures of the hardware components of the payload (102) and/or other devices (e.g., other devices that are part of the IHS (100) and/or devices that are not part of the IHS (100)).

For example, the air movers (104) may be positioned and oriented within a chassis (106) of the IHS (100) to generate air flows within that chassis (106) that interact with the hardware components of the payload (102). For example, the air movers (104) may be positioned and oriented with respect to the payload (102), air intakes (e.g., 108) of the chassis, air exhausts (not shown, behind the air movers in the figure) of the chassis (106), and/or other features of the IHS (100). The interactions between the air flows and the hardware components of the payload (102) may cause thermal energy to be extracted from the hardware components of the payload (102) thereby decreasing the temperatures of the hardware components.

The air movers (104) may be operated using electric power. To operate the air movers (104), electric power may be selectively provided to the air movers (104). Selectively providing power may include, for example, varying the voltage level used to provide power to the air movers (104), pulse width modulating (e.g., providing power for a first period of time, not providing power for a second period of time, and repeating) power provided to the air movers (104), etc. By doing so, the rate of air flow (and/or other characteristics of the air flow) generated by an air mover may be modified.

However, different types of air movers (104) may respond differently to being provided different types of selectively provided power. For example, different types of air movers (104) may require power provided at different voltage levels, pulse width modulation rate, etc. to provide the same air flow rates. Each of the air movers (104) may have a predetermined range of manners in which power may be provided that results in desirable operation of the air movers. If power is selectively provided to the air movers (104) in a manner outside of the predetermined range, the air movers may (i) operate in an undesirable manner, (ii) have a reduced service life, and/or (iii) may be damaged or rendered inoperable.

Embodiments of the invention may provide methods, devices, and/or systems for managing the thermal states of the components of IHSs. To do so, the types of air movers (104) may be identified. The identified types of the air movers may be used, for example, to (i) select the manner in which power is selectively provided to the air movers, (ii) select the manner in which other components of the device in which the air mover is disposed will operate (e.g., limit power consumption based on how much air flow a device will receive), etc. By doing so, (i) the air movers may operate in a desired manner (e.g., generate air flows at predetermined rate), (ii) the service life of the air movers may be maintained, and/or (iii) damage to the air movers due to the selective application of power to the air movers that is outside of the predetermined range may be avoided.

To do so, the air movers (104) may include functionality to enable other identities to identify a type of the air mover. A thermal manager (not shown, refer to FIG. 2 for additional details regarding the thermal manager) of the IHS (100) tasked with managing the temperatures of the hardware components of the payload (102) and/or other components of the IHS (100)/other devices may utilize the aforementioned functionality of the air movers (104). For additional details regarding air movers (104), refer to FIGS. 1.2-1.3.

While the IHS (100) of FIG. 1.1 has been illustrated and described as including a specific number and type of components, an IHS in accordance with one or more embodiments of the invention may include additional, fewer, and/or different components without departing from the invention.

Figure 3:
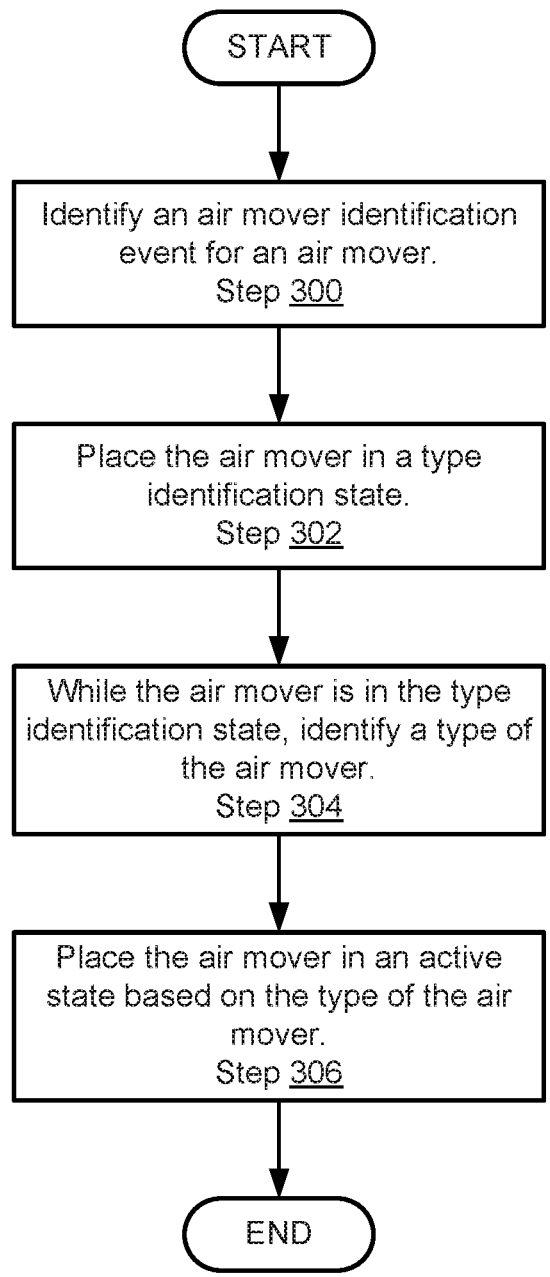
FIG. 3 shows a flow chart of a method of providing thermal management services in accordance with one or more embodiments of the invention.

As discussed above, IHSs in accordance with embodiments of the invention may utilize air movers (104) to manage the temperatures (e.g., thermal states) of components used by the IHSs to provide computer implemented services. FIGS. 2 and 3 shows diagrams of IHSs that may be used by IHSs.

FIG. 2 shows a diagram of an air mover (120) in accordance with one or more embodiments of the invention. Any of the air movers (104, FIG. 1.1) illustrated in and described with respect to FIG. 1.1 may be similar to the air mover (120).

The air mover (120) may provide air flow generation services. Air flow generation services may include selectively generating air flows. The air flows may be selectively generated by having different rates and/or other characteristics. The characteristics of air flows generated by the air mover (120) may depend on the manner in which power is provided to the air mover. Consequently, air flows having different characteristics may be selectively generated by supplying power to the air mover (120) in different manners (e.g., voltage/current level, pulse width modulation rates implemented using different on/off ratios, etc.).

To provide air flow generation services, the air mover (120) may include a housing (122), a drive element (124), a harness (126), and a type identifier (132). Each of these components of the air mover (120) is discussed below.

The housing (122) may be a physical structure adapted to (i) house the drive element and/or other components of the air mover (120) and/or (ii) facilitate generation of an air flow by the air mover (120). The housing (122) may, for example, by implemented as a rectangular structure having holes on two sides and a hollow (or partially hollow) interior. The shape, size, and/or other characteristics of the housing (122) may be adapted to position and/or orient the drive element (124) within the interior of the housing (122). The housing (122) may be formed of any suitable material including, for example, plastics and metals.

The drive element (124) may be a physical structure that utilizes electrical power to move. When moving and disposed in the housing (122), an air flow through the housing (122) may be generated. The drive element (124) may respond differently to various manners of being provided electric power resulting in the drive element (124) moving at different speeds thereby generating air flows of different rates.

The shape, size, position, and/or orientation of the drive element (124) may be adapted to cause the air mover (120) to generate an air flow directed in a predetermined manner.

The drive element (124) may be implemented using, for example, an electric motor and fan blades operably connected to a drive shaft of the motor. The drive element (124) may be implemented using additional, fewer, and/or different components without departing from the invention.

The harness (126) may be a physical device adapted to electrically connect the air mover (120) to another device. For example, the harness (126) may include a connector (130) having a form factor adapted to physically connect with a complimentary connector (e.g., a jack and a plug). The connector (130) may include sufficient pins to (i) obtain power and (ii) enable a type of the air mover (120) to be identified by a device connected to the connector (130).

The harness (126) may also include cabling (128). The cabling (128) may electrically connect the connector (130) to the drive element (124), the type identifier (132), and/or other components of the air mover (120).

In one or more embodiments of the invention, the connector (130) is a three-pin connector. The cabling (128) may similarly include three wires. In such a scenario, two of the pins and wires may be used to supply power to the drive element and two wires (one of the wires is also used for supplying power to the drive element) of the wires may be used to facilitate identification of the type of the air mover (120). Refer to FIG. 1.3 for details regarding the electrical topology of the air mover (120).

The connector (130) and cabling (128) may include different numbers of wires and pins without departing from the invention.

The type identifier (132) may be a physical device adapted to facilitate identification of the type of the air mover (120). In one or more embodiments of the invention, the type identifier (132) is implemented as a resistive element having a predetermined resistance. As will be discussed with respect to FIG. 1.3, the predetermined resistance of the resistive element may be adapted to enable other entities to identify the type of the air mover (120). For example, the resistive element may be used as part of a voltage divider that presents a voltage associated with the type of the air mover (120).

While the type identifier (132) is illustrated in a specific location (e.g., part of the cabling (128), the type identifier (132) may be located in other physical locations of the air mover (120) without departing from the invention. For example, the type identifier (132) may be disposed inside the housing (122).

While the air mover (120) of FIG. 1.2 has been illustrated and described as including a specific number and type of components, an air mover in accordance with one or more embodiments of the invention may include additional, fewer, and/or different components without departing from the invention.

Turning to FIG. 1.3, FIG. 1.3 shows an electrical schematic diagram of the air mover (120) of FIG. 1.2 in accordance with one or more embodiments of the invention.

As seen in FIG. 1.3, the schematic includes a resistance (Rfan) representing the resistance of the drive element (124, FIG. 1.2) of the air mover (120), a resistance (R2) representing a resistance of the type identifier (132, FIG. 1.2), and a resistance of the harness (126, FIG. 1.2).

The resistances of the type identifier and harness (R1, R2) may be fixed. For example, these resistances do not change depending on the operation of the air mover (120). In contrast, the resistance of the drive element (Rfan) may vary depending on the operation of air mover (120).

For example, when the drive element is operating, the resistance that it present may varying depending on, for example, the rate and directions of air flows within an ambient environment in which the air mover (120) is disposed, the temperature of the drive element, and/or other factors. Consequently, when voltage potentials are applied to the type identifier while the air mover (120) is in an active state during which power is being supplied to the drive element, the variable resistance presented by the drive element may prevent the type identifier from being used to identify a type of the air mover (120).

Specifically, consider a scenario where a drive power supply (140) is attached as illustrated in FIG. 1.3. Such a scenario may occur when power is being provided to the air mover (120). In such a scenario, the resistance of the drive element (Rfan) may vary over time due to conditions outside the control of the air mover (120) (e.g., load placed on the drive element due to counter air flows, etc.)

If, for example, a sensing power supply (142) is used to apply a voltage potential as illustrated in FIG. 1.3, measurements of a voltage using a voltage sensor (144) as illustrated in FIG. 1.3 may vary depending on the resistance being presented by the drive element. Consequently, the voltage measurement may not be used to identify a type of the air mover (120) due to the impact of the variable resistance of the drive element.

As will be discussed below, the drive power supply (140), sensing power supply (142), and the voltage sensor (144) may be controlled by a thermal manager in an IHS as shown in FIG. 1.1. In some embodiments of the invention, the drive power supply (140) and/or the sensing power supply (142) operate independently of the thermal manager. For example, the sensing power supply (142) may be implemented as a constant power/voltage source that continuously outputs a voltage. In such a scenario, a sensing voltage applied by a sensing power supply (142) may be constantly applied.

The resistance R3 in FIG. 1.3 may be of a predetermined value. The values of R3 and R2 may be adapted so that when predetermined voltage levels are generated by the sensing power supply (142), voltage levels corresponding to different types of air movers will be present at the location where the voltage level is measured by the voltage sensor.

Due to variability in how harnesses are manufactured, the value of R1 may vary within a predetermined range. Consequently, the voltages measured by the voltage sensor (144) may be compared to different ranges that are each associated with different types of air movers. By doing so, the types of the air movers may be identified using the voltage level measured by the voltage sensor (144).

As discussed with respect to FIG. 1.3, a thermal state manager of an IHS may supply power to air movers to (i) generate air flows and (ii) identify the types of the air movers. FIG. 2 shows a logical diagram of the IHS (100) in accordance with embodiments of the invention.

The IHS (100) may include a thermal state manager (200) and air movers (202). Each component of the IHS (100) is discussed below.

The thermal state manager (200) may provide thermal state management services. Thermal state management services may include (i) identifying the types of the air movers (202), (ii) identifying the thermal states of hardware devices managed by the thermal state manager (200), and/or (iii) operating the air movers based on the identified types of the air movers (202) to manage the thermal states of the hardware devices.

To identify the types of the air movers (202), the thermal state manager (200) may (i) place the air movers (202) into a type identification state and (ii) while in the type identification state, identify a type of the air mover. The type identification state may be a state in which the resistance of the drive element is of a known and unvarying value. The air movers (202) may be placed into type identification states by, for example, depowering the drive elements (or verifying that the drive elements are depowered) and/or placing the drive elements into a predetermined mechanical state (e.g., not moving). The drive elements may be depowered selectively.

In one or more embodiments of the invention, one or more of the drive elements are depowered by modifying a pulse width modulation used to power the drive elements. For example, the duty cycle of the pulse width modulation may be modified to slow and/or stop mechanical motion of the drive elements without entirely removing power from the drive elements.

The thermal state manager (200) may include functionality to control the operation of the drive power supply (140), the sensing power supply (142), and the voltage sensor (144) as described with respect to FIG. 1.3. For example, the aforementioned components may be portions of the IHS (100) that are operably connected to the thermal state manager (200).

The IHS (100) may control the operation of the aforementioned components by, for example, sending messages to the components indicating the manner in which the components are to operate. The components may modify their operation in accordance with the information included in the messages. Similarly, the components may send messages to the thermal state manager (200) including, for example, results of voltage measurements. The IHS (100) may control the operation of the components using other methods without departing from the invention.

To utilize the voltage measurements provided by the voltage sensor (144) to ascertain a type of an air mover, the thermal state manager (200) may compare the voltage measurement to information included in a data structure such as a table that specifies ranges of voltages that correspond to different types of air movers. The table may be (i) maintained by the thermal state manager (200) or other entities, (ii) stored in the IHS (100) or other locations, and/or (iii) updated at varying points in time or may be static. The data structure that includes the information regarding the voltage ranges may be implemented using different data structure types such as, for example, lists, linked lists, database, etc. without departing from the invention.

To identify the thermal state of the hardware devices, the thermal state manager (200) may read any number of sensors to obtain information regarding the thermal states of the hardware devices, may obtain the information regarding the thermal states of the hardware devices from the hardware devices, or may obtain the information via other means. The information may be aggregated and used to decide how to operate the air movers (202) in a manner that enables the thermal states of the hardware devices to be regulated.

To operate the air movers based on the identified types of the air movers (202) to manage the thermal states of the hardware devices, the thermal state manager (200) may compare the thermal states of the hardware devices to predetermined thermal states (e.g., temperature ranges). The comparison may be used to ascertain whether the thermal state of the hardware devices should be modified. If it is desirable to modify the thermal states of the hardware devices, the thermal state manager (200) may change the manner in which power is being supplied to the air movers to modify the corresponding air flows generated by the air movers. By doing so, the rate at which thermal energy from the hardware devices is dissipated may be modified. Consequently, the thermal states of the hardware devices may be managed to meet the predetermined thermal states.

In one or more embodiments of the invention, the thermal state manager (200) is implemented using a hardware device including circuitry. The hardware device may be, for example, a digital signal processor, a field programmable gate array, or an application specific integrated circuit. The thermal state manager (200) may be implemented using other types of hardware devices without departing from the invention.

In one or more embodiments of the invention, the thermal state manager (200) is implemented using computing code stored on a persistent storage (e.g., 506, FIG. 5) that when executed by a processor performs the functionality of the thermal state manager (200). The processor may be a hardware processor (e.g., 502, FIG. 5) including circuitry such as, for example, a central processing unit or a microcontroller. The processor may be other types of hardware devices for processing digital information without departing from the invention.

When providing the functionality of the thermal state manager (200), the thermal state manager (200) may perform all, or a portion, of the methods illustrated in FIG. 3.

The air movers (202) may be similar to those discussed with respect to FIGS. 1.1-1.3.

While the IHS (100) of FIG. 2 has been illustrated and described as including a specific number and type of components, an IHS in accordance with one or more embodiments of the invention may include additional, fewer, and/or different components without departing from the invention. Additionally, while the thermal state manager (200) is illustrated in FIG. 2 as being a component of the IHS (100), the thermal state manager (200) may be separate from the IHS (100) without departing from the invention. For example, the thermal state manager (200) may be a separate device that is operably connected to the IHS (100). In such a scenario, the thermal state manager (200) may provide thermal state management services to one or more IHSs without departing from the invention. Further, even if a part of the IHS (100), the thermal state manager (200) may provide thermal state management services to other IHSs in addition to the IHS (100).

As discussed above, the IHS of FIG. 1 may manage the thermal states of hardware devices. FIG. 3 shows a method that may be performed by components of the system of FIG. 1 to manage thermal states.

FIG. 3 shows a flowchart of a method in accordance with one or more embodiments of the invention. The method depicted in FIG. 3 may be used to manage thermal states in accordance with one or more embodiments of the invention. The method shown in FIG. 3 may be performed by, for example, a thermal state manager (e.g., 200, FIG. 2). Other components of the IHS (or devices that are not a part of the IHS) of FIG. 1.1 may perform the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, an air mover identification event for an air mover is identified. The air mover identification event may be, for example, an addition of the air mover to an IHS, an identification of an IHS that is of an unknown type, a restart of an IHS, or any other event that may result in an air mover that is a part of an IHS (or provides air flow services to an IHS) being of an unknown type.

In step 302, the air mover is placed in a type identification state. A type identification state may be a state in which the electrical characteristics of the air mover are in a predetermined state.

In one or more embodiments of the invention, the air mover is placed in a type identification state by forcing a drive element of the air move to present a known resistance. The drive element may be forced to present a known resistance by, for example, depowering the drive element and verifying that the drive element is in a predetermined mechanical state. The predetermined mechanical state may be, for example, a non-moving state. For example, if a tachometer is available to measure a rotational rate of the drive element, the tachometer may be used to verify that the drive element is not rotating. Other types of sensors may be used to verify that the drive element is in a predetermined mechanical state without departing from the invention.

The manner in which the air mover is placed in the type identification state may depend on the manner in which the air mover is being operated at the time when the air mover is to be placed in the type identification state. For example, if the IHS was just turned on, it may not be necessary to verify the mechanical state of the air mover.

In step 304, while the air mover is in the type identification state, the type of the air mover is identified.

In one or more embodiments of the invention, the type of the air mover is identified by applying a voltage to a type identifier of the air mover. When the voltage is applied, a second voltage associated with the type identifier may be read. The second voltage may be, for example, a voltage at a mid-node of a voltage divide (e.g., the node which the voltage sensor (144) of FIG. 1.3 is adapted to read) of which the type identifier is a member. Consequently, the value of the second voltage may depend on the resistance value of the type identifier. Accordingly, the resistance value of the type identifier may be adapted to enable the read second voltage to indicate a type of the air mover.

The read second voltage may be matched to a voltage range associated with the type of the air mover. For example, a tabling that associates voltage ranges with different types of air movers may be used to identify the type of the air mover by identifying the voltage range in which the read second voltage falls. The air mover may be identified as the type of the air mover associated with the identified voltage range.

In step 306, the air mover is placed in an active state based on the type of the air mover.

The air mover may be placed in the active state based on the type of the air mover by supplying power to the air mover in a manner that is associated with the type of the air mover. For example, a table that specifies different manners of powering different types of air movers may be used to identify the manner in which the air mover is to be powered based on the type of the air mover.

Once the manner of powering the air mover is identified, a drive power supply may be instructed to power that air mover in accordance with the identifier manner of powering the air mover. For example, the voltage level, current level, or pulse width modulation rate may be implemented by the drive power supply consistently with the identified manner of powering the air mover. Consequently, the air mover may operate in a predetermined manner consistent with its type.

While in the active state, the air mover may generate a predetermined air flow. For example, the air mover may generate an air flow having a desired flow rate. If the air mover is not supplied power based on its type, the air mover may not generate the predetermined air flow, may be damaged, or may otherwise operate in a manner that may make it more difficult or impossible for the thermal manager to manage the thermal states of hardware devices.

The air mover may be placed in the active state at a point in time that depends on a state of the air mover prior to being placed in the type identification state. For example, if the air mover was in an active state prior to being placed in the type identification state, the air mover may be placed in the active state immediately after the type of the air mover is identified. In contrast, if the air mover was not in an active state (e.g., a suspended/off state), the air mover may not be placed into the active state following the type of the air mover being identified until a need arises for an air flow to be generated to manage a thermal state of a hardware device.

The method may end following step 306.

Figure 5:
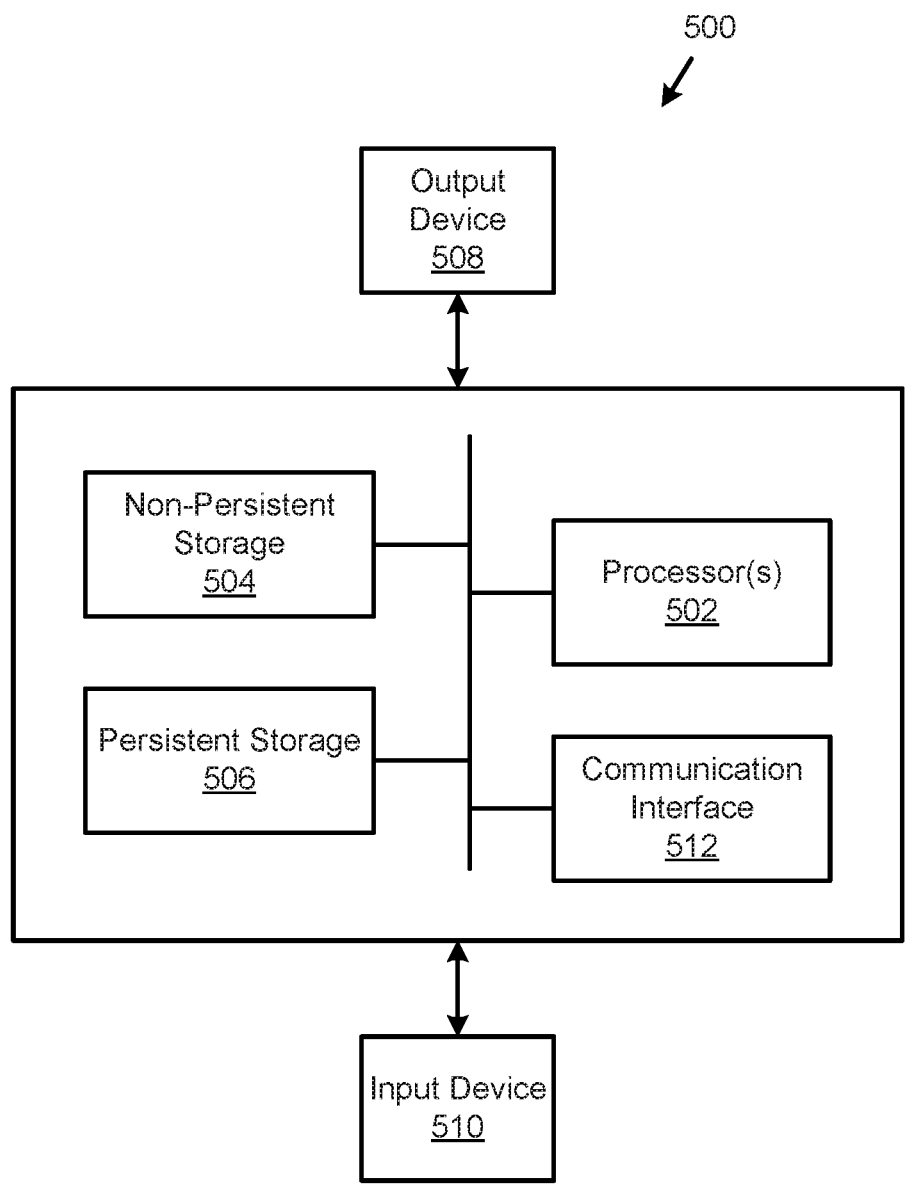
FIG. 5 shows a diagram of a computing device in accordance with one or more embodiments of the invention.

Using the method illustrated in FIG. 5, the thermal states of components of an IHS may be managed in an efficient manner by identifying the types of air movers available for generating air flows within the IHS. By identifying the types of the air movers, the air movers may be powered in a manner that reduces the likelihood that air movers become damaged, enables desired air flows to be generated thereby improving the ability of the IHS to provide thermal management services, and improve the efficiency of the operation of the air movers.

To further clarify embodiments of the invention, a non-limiting example is provided in FIGS. 4.1-4.5. FIGS. 4.1-4.3 shows a system similar to that illustrated in FIG. 1 at different points in time. FIGS. 4.4-4.5 show diagrams of actions performed by and interactions between components shown in FIGS. 4.1-4.3 over time. For the sake of brevity, only a limited number of components of the system of FIG. 1 are illustrated in each of FIGS. 4.1-4.5.

Example

Consider a scenario as illustrated in FIG. 4.1 in which an IHS (400) is providing computer implemented services to clients (not shown). When providing the computer implemented services, an air mover (402) generates an air flow to manage the thermal state of the components of the IHS (400). At the point in time illustrated in FIG. 4.1, the type of the air mover (402) is known. Consequently, the thermal state manager (not shown) is able to selectively power the air mover (402) in manners consistent with the type of the air mover (402).

At a first point in time, the air mover (402) becomes damaged due to a portion of the drive element of the air mover (402) failing. To remedy the failure of the air mover (402), the air mover (402) is removed from the IHS (400) as illustrated in FIG. 4.2.

After the air mover (402) is removed, a new air mover (404) is added to the IHS (400) as illustrated in FIG. 4.3. The new air mover (404) is of a different type (is of a different size and includes a different type of drive element) from that of the air mover (402). Consequently, the new air mover (404) requires that it be selectively powered in manners different from that of the air mover (402) which it replaced. However, the thermal manager (not shown) of the IHS (400) is unaware of the type of the new air mover (404).

After the new air mover (404) is added to the IHS (400) a number of actions and interactions occurred as illustrated in FIGS. 4.4-4.5. FIGS. 4.4-4.5 illustrate interactions and actions by and between components of the system of FIG. 4.3. In these figures, the relative occurrence in time of the interactions progresses from the top of each figure (i.e., earlier in time) to the bottom of each figure (i.e., later in time). FIG. 4.5 is a continuation of the diagram of FIG. 4.4.

In other words, element 430 indicates the first interaction that occurs in time while element 452 indicates the last interaction that occurs.

Turning to FIG. 4.4, after the new air mover (404) is added, the thermal manager (420) of the IHS (400) identifies that an air mover identification event (430) has occurred. Specifically, the thermal manager (420) identifies that the presence of the new air mover (404) that is of an unknown type is an air mover identification event.

In response to identifying the air mover identification event, the thermal manager (420) sends a suspend power request (432) to a drive power supply (414) of the IHS (400) that is able to power the drive element of the new air mover (404). In response to receiving the suspend power request, the drive power supply (414) suspends providing power (434) to the new air mover (404). By doing so, the new air mover (404) is placed into a type identification state.

While not illustrate din FIG. 4.4, the thermal manager (420) also verify the mechanical state of the new air mover (404) as part of placing the new air mover (404) into the type identification state. Here, the mechanical state of the new air mover (404) was not verified because the IHS (400) was just turned on which means that the new air mover (404) was not moving prior to the air mover identification event being identified. Accordingly, verification of the mechanical state of the new air mover (404) was not required to place the new air mover (404) into the type identification state.

The thermal manager (420) sends a sensing voltage request (436) to a sensing power supply (412) after placing the new air mover (404) into the type identification state. The sensing voltage request (436) that requests that the sensing power supply (412) apply a predetermined voltage to a type identifier (not shown) of the new air mover (404).

In response to receiving the sensing voltage request (436), the sensing power supply (412) supplies a sensing voltage (438) with appropriately applies a voltage across a voltage divider including the type identifier.

While the sensing voltage is supplied, the thermal manager (420) sends a sense voltage request (440) to a voltage sensor (416). The sense voltage request (440) requests that the voltage sensor (416) measure the voltage of the voltage divider to which the sensing voltage is applied.

In response to obtaining the sensing voltage request (440), the voltage sensor (416) senses the voltage of the voltage divider and provides the sensed voltage (442) to the thermal manager (420). Turning to FIG. 4.5, the thermal manager (420) performs a table lookup using the sensed voltage (444) to identify a type of the new air mover (404).

Using the type of the new air mover (404), the thermal manager (420) identifies the manner in which the new air mover (404) should be selectively power. Using the identified manner of selectively powering the new air mover (404), the thermal manager (420) sends a resume power request (446) to the drive power supply (414). The resume power request (446) requests that the drive power supply (414) beings powering the new air mover (404) in a manner consistent with the identifier manner of selectively powering the new air mover (404).

In response to obtaining the resume power request (446), the drive power supply (414) resumes powering (448) the new air mover (404) in a manner consistent with the identified manner of powering the new air mover (404). Consequently, the new air mover (404) is controllable by the thermal manager (420) and enables the thermal manager (420) to manage the thermal states of the components of the IHS (400).

The thermal manager (420) also sends a suspend voltage request (450) to the sensing power supply (412). In response to the suspend voltage request (450), the sensing power supply (412) suspends the sensing voltage (452). In other words, stops applying a voltage to the type identifier.

End of Example

Thus, as illustrated in FIGS. 4.1-4.5, embodiments of the invention may facilitate the identification of air movers in a cost efficient and effective manner.

As discussed above, embodiments of the invention may be implemented using computing devices. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., short-range radio interface such as a Bluetooth interface, infrared interface, network interface, optical interface, etc.), input devices (510), output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing devices exist, and the aforementioned input and output device(s) may take other forms.

Embodiments of the invention may provide a method and system for identifying air movers in a cost effective, efficient manner, and accurate manner. To do so, the system may place air movers into a type identification state prior to attempting to identify the type of the air mover. By placing the air movers into the type identification state, the accuracy of performing an identification of the air movers may be improved when compared to attempting to identify the types of the air movers when in active states. By doing so, embodiments of the invention may provide a system that (i) improves type identification of air movers, (ii) reduces the likelihood that air movers will be damaged or operate in an undesirable manner, and/or (iii) decrease the cost of air mover type identification by enabling low cost devices to be used to efficiently identify the types of the air movers.

Thus, embodiments of the invention may address the problems of thermal management of computing devices.

The problems discussed above should be understood as being examples of problems solved by embodiments of the invention of the invention and the invention should not be limited to solving the same/similar problems. The disclosed invention is broadly applicable to address a range of problems beyond those discussed herein.

One or more embodiments of the invention may be implemented using instructions executed by one or more processors of a computing device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as of the invention. Accordingly, the scope of the invention should be limited only by the attached claims.

What is claimed is:

1. An information handling system, comprising:
   an air mover comprising a type identifier, wherein the type identifier comprises a first resistor having a first resistance; and
   a thermal manager programmed to:
      identify an air mover identification event for the air mover;
      in response to identifying the air mover identification event:
         place the air mover in a type identification state, and
         while the air mover is in the type identification state, identify a type of the air mover by applying a sensing voltage to the type identifier and measuring a resulting voltage level of the type identifier, wherein the type identifier comprises of at least a drive element of the air mover and a harness of the air mover, and wherein identifying the type of air mover comprises applying the sensing voltage to at least one of the drive element of the air mover and the harness of the air mover; and
      after identifying the type of the air mover, place the air mover in an active state based on the type of the air mover.

2. The information handling system of claim 1, wherein the type identifier:
   identifies the type of the air mover while the air mover is in the type identification state, and
   does not identify the type of the air mover while the air mover is in the active state.

3. The information handling system of claim 1, wherein placing the air mover in the type identification state comprises:
   depowering the drive element of the air mover.

4. The information handling system of claim 3, wherein placing the air mover in the type identification state further comprises:
   ensuring that a drive rate of the drive element has reached a predetermined drive rate.

5. The information handling system of claim 1, wherein the harness is a three wire harness.

6. The information handling system of claim 1, wherein the type identifier further comprises:
   a voltage divider having a second resistance used by a voltage sensor for measuring the resulting voltage level of the type identifier.

7. A method for managing an information handling system, comprising:

identifying an air mover identification event for an air mover of the information handling system;

in response to identifying the air mover identification event:

placing the air mover in a type identification state, and while the air mover is in the type identification state, identifying a type of the air mover by applying a sensing voltage to a type identifier having a first resistor with a first resistance, and measuring a resulting voltage level of the type identifier, wherein the type identifier comprises of at least a drive element of the air mover and a harness of the air mover, and wherein identifying the type of air mover comprises applying the sensing voltage to at least one of the drive element of the air mover and the harness of the air mover; and after identifying the type of the air mover, placing the air mover in an active state based on the type of the air mover.

8. The method of claim 7, wherein
the type identifier:
identifies the type of the air mover while the air mover is in the type identification state, and
does not identify the type of the air mover while the air mover is in the active state.

9. The method of claim 7, wherein placing the air mover in the type identification state comprises:
depowering the drive element of the air mover.

10. The method of claim 9, wherein placing the air mover in the type identification state further comprises:
ensuring that a drive rate of the drive element has reached a predetermined drive rate.

11. The method of claim 7, wherein the harness is a three wire harness.

12. The method of claim 7, wherein the type identifier further comprises:
a voltage divider having a second resistance used by a voltage sensor for measuring the resulting voltage level of the type identifier.

13. A non-transitory computer readable medium comprising computer readable program code, which when executed by a computer processor enables the computer processor to perform a method for managing an information handling system, the method comprising:

identifying an air mover identification event for an air mover of the information handling system;

in response to identifying the air mover identification event:

placing the air mover in a type identification state, and while the air mover is in the type identification state, identifying a type of the air mover by applying a sensing voltage to a type identifier having a first resistor with a first resistance, and measuring a resulting voltage level of the type identifier, wherein the type identifier comprises of at least a drive element of the air mover and a harness of the air mover, and wherein identifying the type of air mover comprises applying the sensing voltage to at least one of the drive element of the air mover and the harness of the air mover; and after identifying the type of the air mover, placing the air mover in an active state based on the type of the air mover.

14. The non-transitory computer readable medium of claim 13, wherein:
the type identifier:
identifies the type of the air mover while the air mover is in the type identification state, and
does not identify the type of the air mover while the air mover is in the active state.

15. The non-transitory computer readable medium of claim 13, wherein placing the air mover in the type identification state comprises:
depowering the drive element of the air mover.

16. The non-transitory computer readable medium of claim 15, wherein placing the air mover in the type identification state further comprises:
ensuring that a drive rate of the drive element has reached a predetermined drive rate.

17. The method of claim 13, wherein the harness is a three wire harness.

* * * * *